(12) United States Patent
Kim et al.

(10) Patent No.: US 7,227,257 B2
(45) Date of Patent: Jun. 5, 2007

(54) COOLING MICRO-CHANNELS

(75) Inventors: Sarah E. Kim, Portland, OR (US); R. Scott List, Beaverton, OR (US); Alan Myers, Portland, OR (US)

(73) Assignee: Intel Corporation, Santa Clara, CA (US)

(\*) Notice: Subject to any disclaimer, the term of this patent is extended or adjusted under 35 U.S.C. 154(b) by 844 days.

(21) Appl. No.: 10/315,565

(22) Filed: Dec. 9, 2002

(65) Prior Publication Data

US 2004/0145047 A1   Jul. 29, 2004

(51) Int. Cl.
*H01L 23/34* (2006.01)
*H01L 23/10* (2006.01)
(52) U.S. Cl. .............. 257/713; 257/707; 257/714; 257/719; 257/721; 257/E23.051
(58) Field of Classification Search .......... 257/713, 257/714, 707, 719, 721
See application file for complete search history.

(56) References Cited

U.S. PATENT DOCUMENTS

| | | | | |
|---|---|---|---|---|
| 5,146,314 | A | \* | 9/1992 | Pankove .................. 257/712 |
| 5,371,407 | A | \* | 12/1994 | Goldman ................. 257/675 |
| 5,801,442 | A | | 9/1998 | Hamilton et al. |
| 5,835,345 | A | | 11/1998 | Staskus et al. |
| 5,998,240 | A | | 12/1999 | Hamilton et al. |
| 6,034,430 | A | \* | 3/2000 | Hamburgen et al. ........ 257/722 |
| 6,129,145 | A | | 10/2000 | Yamamoto et al. |
| 6,457,515 | B1 | | 10/2002 | Vafai et al. |
| 2003/0062149 | A1 | | 4/2003 | Goodson et al. ........ 165/104.11 |
| 2003/0080436 | A1 | \* | 5/2003 | Ishikawa ................. 257/776 |
| 2003/0164231 | A1 | | 9/2003 | Goodson et al. ........ 165/104.11 |

\* cited by examiner

*Primary Examiner*—Nitin Parekh
(74) *Attorney, Agent, or Firm*—Trop, Pruner & Hu, P.C.

(57) ABSTRACT

The present disclosure relates generally to microelectronic technology, and more specifically, to an apparatus used for the cooling of active electronic devices utilizing micro-channels or micro-trenches, and a technique for fabricating the same.

3 Claims, 13 Drawing Sheets

COOLING MICRO-CHANNELS

BACKGROUND

1. Field

The present disclosure relates generally to microelectronic technology, and more specifically, to an apparatus used for the cooling of active electronic devices utilizing micro-channels or micro-trenches, and a technique for fabricating the same.

2. Background Information

There has been rapid development in microelectronic technology, and as a result, microelectronic components are becoming smaller, and circuitry within microelectronic components is becoming increasingly dense. With a decrease in the size of components and an increase in circuit density, heat generation typically increases. Heat dissipation is becoming more critical as the technology develops.

Various techniques may typically be used to remove or dissipate heat generated by a microelectronic component. A microelectronic component or microelectronic package often includes a microelectronic die encased with in a microelectronic case. These techniques may include passive or active solutions. One such technique, which may be classified as a passive solution, involves the use of a mass of conductive material which may be alternatively referred to as a slug, heat sink, or heat spreader. One of the primary purposes of a heat spreader is to spread, or absorb and dissipate the heat generated by a microelectronic die. This may at least in part eliminate "hot spots" within the microelectronic die.

A heat sink may achieve thermal contact with a microelectronic die by use of a thermally conductive material, such as a thermal interface material (TIM) deposited between the die and the heat sink. The heat sink is often attached to the top of the microelectronic component. Often the heat sink is attached to the microelectronic case and not the microelectronic die. Typical thermal interface materials may include, for example, thermally conductive gels, grease or solders. Typical heat sinks are constructed of thermally conductive material, such as, aluminum, electrolytically plated copper, copper alloy, or ceramic, for example.

A water-cooling system is another technique, which may be classified as an active technique, may be used to dissipate heat generated by a microelectronic package. Typically, a water-cooling system transfers heat from the microelectronic package to water, which becomes hot. The technique is considered active because the now hot water is pumped away from the microelectronic package and cooler water in pumped towards the microelectronic package. The cool water transfers additional heat from the package to the water, which becomes hot. In turn, this water is typically pumped away from package and the cycle repeats itself.

Often a water-cooling system utilizes heat sinks to transfer heat from the package to the water. The water often runs through a series of pipes and often the heat sinks themselves. Typically contact between the microelectronic case and the water is avoided, and contact between the microelectronic die and the water is often greatly avoided. These techniques, both active and passive, often attempt to dissipate heat from the entire microelectronic package, regardless of whether only a portion of the package requires heat dissipation. In addition, these techniques generally dissipate heat from the microelectronic case, as opposed to the microelectronic die where the heat is often produced.

BRIEF DESCRIPTION OF THE DRAWINGS

Subject matter is particularly pointed out and distinctly claimed in the concluding portions of the specification. The disclosed subject matter, however, both as to organization and the method of operation, together with objects, features and advantages thereof, may be best understood by a reference to the following detailed description when read with the accompanying drawings in which:

DETAILED DESCRIPTION

In the following detailed description, numerous details are set forth in order to provide a thorough understanding of the present disclosed subject matter. However, it will be understood by those skilled in the art that the disclosed subject matter may be practiced without these specific details. In other instances, well-known methods, procedures, components, and circuits have not been described in detail so as to not obscure the disclosed subject matter.

Figure 1:
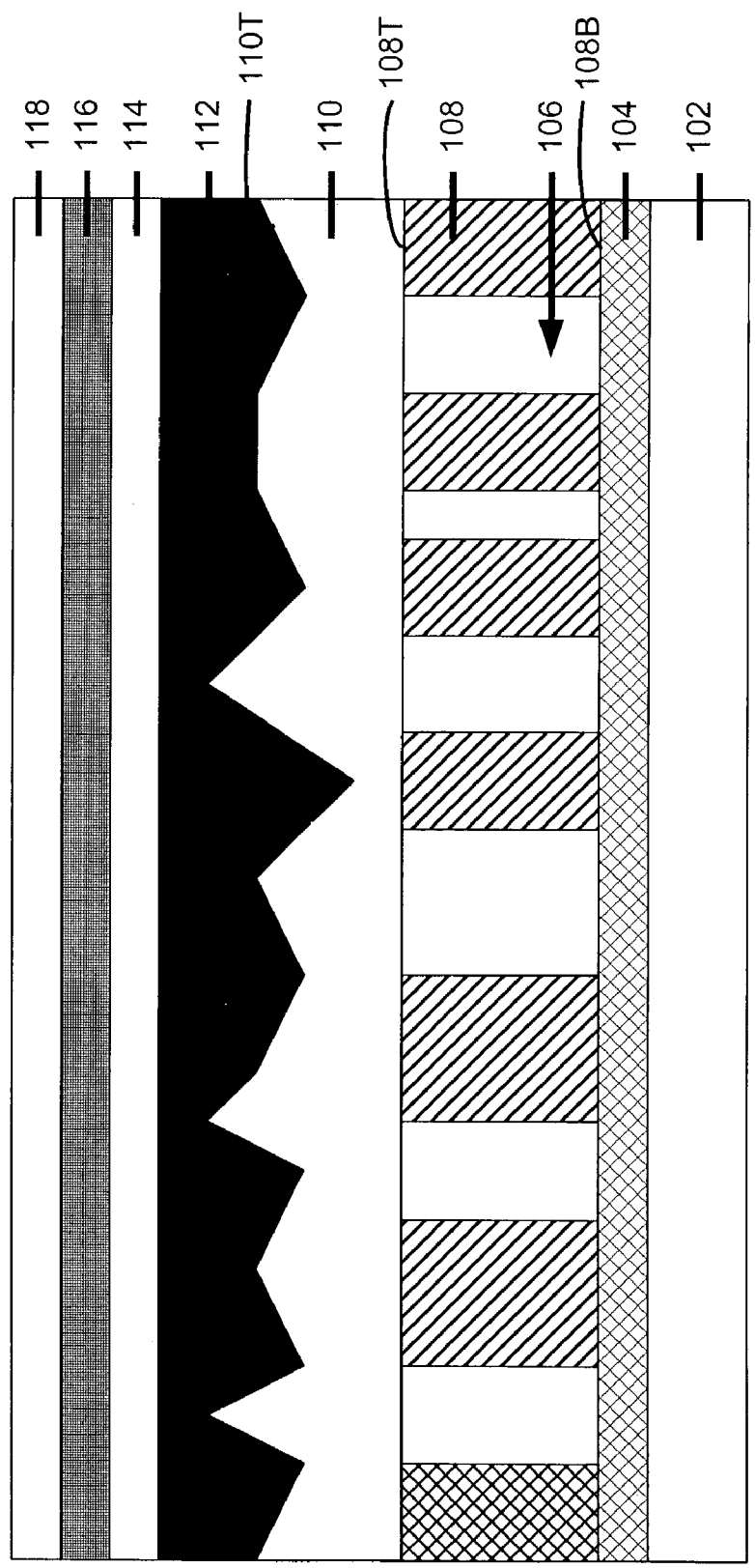
FIG. 1 is a cross sectional diagram of a microelectronic package illustrating an embodiment in accordance with the disclosed subject matter.

FIG. 1 is a cross sectional diagram of a microelectronic package illustrating an embodiment in accordance with the disclosed subject matter. In this embodiment, the cross section of the package includes a substrate 108. A number of micro-channels 106 may be etched into the substrate 108. However, it is contemplated that the micro-channels may be formed by techniques other than etching. It is contemplated that the micro-channels may have a variety of cross sectional shapes, such as, for example, rectangular.

It is contemplated that, in this context, when orienting terms, such as, for example, "top," "above," or "side," are used, the terms are simply for illustrative purposes and do not mean that the disclosed subject matter is fixed to a certain orientation. The disclosed subject matter is obviously not limited to the described orientation and may be, for example, turned upside down from the described embodiment.

Figure 13:
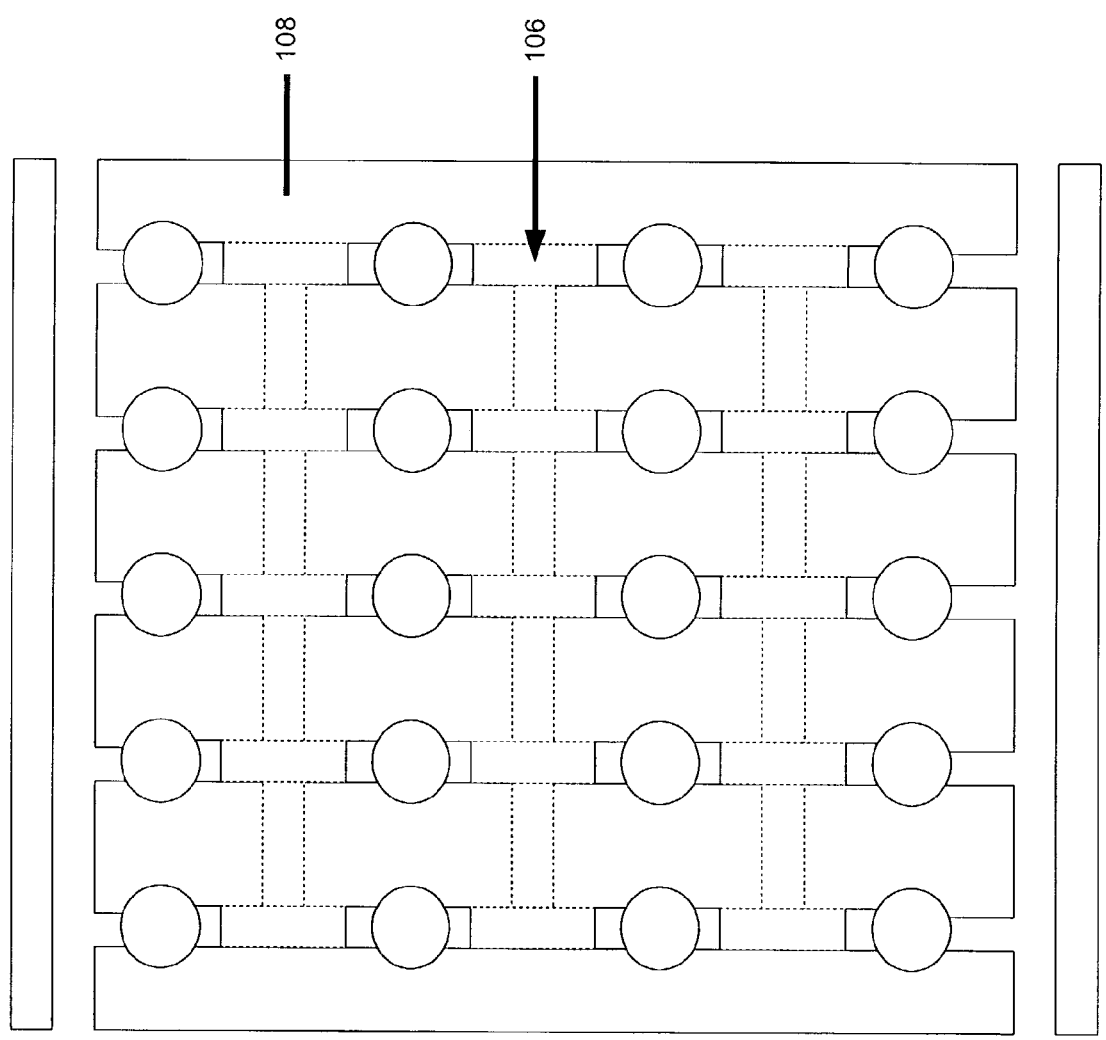
FIG. 13 is a top-down cross sectional diagram of a microelectronic package illustrating an embodiment in accordance with the disclosed subject matter.

Micro-channels 106 may run substantially within the substrate 108. For example, the micro-channels may, if examined from the top (FIG. 13), appear to run from left to right across the substrate. It is contemplated that the micro-channels may be run in a variety of patterns and the disclosed subject matter is not limited to any one micro-channel pattern. It is further contemplated that the micro-channel patterns may be selected based upon a variety of reasons, such as, for example, the heat generation characteristics of the microelectronic package, the heat generation characteristics/geometry of the active and passive electrical devices, or, in another embodiment, ease of manufacture. It is also contemplated that the micro-channels may run both within and without the substrate, through a number of layers. It is yet further contemplated that the micro-channels 106 may intersect or include control elements.

A stop layer 110 may be placed or coupled on top 108T of the substrate 108. This hard layer may be in contact with and even bound micro-channels 106. It is contemplated that micro-channels may run through the stop layer. Stop layer 110 may have a substantially high thermal conductivity, so as to allow the transmittal of heat from layers above the stop layer 110 to the micro-channels 106. These layers may be coupled with the top 110T of the stop layer. Stop layer 110 may have a thermal conductivity in excess of 2 W/cm-K. In one embodiment, the stop layer may be comprised of diamond that may have a thermal conductivity of 6.3 W/cm-K. It is contemplated that other materials may be used besides or in addition to diamond and that this is merely one illustrative example. It is further contemplated that the stop layer may be sufficiently hard, or, in another example, substantially chemically different to provide a mechanism to stop the micro-channels 106 from being etched beyond the substrate 108.

A microelectronic wafer 102 or additional substrate 102 may be coupled to the bottom 108B of substrate 108. It is contemplated that, in one embodiment, the microelectronic wafer 102 may be coupled with the substrate 108 utilizing a layer of thermally conductive adhesive 104. However, this is merely one technique to bond the microelectronic wafer 102 with the substrate 108 may be used, such as, for example, direct or eutectic bonding. Microelectronic wafer 102 may also cap the micro-channels 106. The enclosed micro-channels 106 may be sufficiently sealed to allow the passage of a fluid through the micro-channels.

The micro-channels 106 may facilitate the transference of heat from a layer above the stop layer 110 to the fluid passing through the micro-channels. It is contemplated that the package may allow for the entrance and exit of the fluid. For example, the fluid may exit or enter the package utilizing holes (not shown) in the substrate 108 or microelectronic wafer 102. However, the disclosed subject matter is not limited by any particular plumbing architecture. It is further contemplated that the fluid may have sufficient thermal conductivity to act as a coolant, such as, for example, air, purified water, or oil. It is also contemplated that the fluid may go through a phase transition (e.g., liquid to gas) such that the heat of vaporization may absorb a significant amount of energy. However, the disclosed subject matter is not limited to any particular fluid. It is further contemplated that the fluid may be utilized in cooling components outside of the microelectronic package or, conversely, the fluid may just be utilized to cool the microelectronic package.

Stop layer 110 may be coupled with a number of layers that are coupled to heat generating elements. Stop layer 110 may be coupled with a fill layer 112. It is contemplated that the fill layer may include polished single or poly-crystalline silicon. It is further contemplated that, in one embodiment, the fill layer may include a number of active electrical devices, such as for example, transistors or electro-osmotic pumps. However, it is contemplated that the fill layer may include non-electrical heat generating elements or passive electrical devices, such as thermal sensors. It is also contemplated that in some embodiments, the fill layer 112 may be the top layer of the microelectronic package.

In one embodiments of the disclosed subject matter, the fill layer 112 may be coupled with a layer of silicon 118. It is contemplated that the layer of silicon may include any of the active or passive elements described above. In one embodiment of the disclosed subject matter, the layer of polished silicon and the layer of single crystal may be bonded utilizing a first bonding layer 114, and a second bonding layer 116. In one embodiment, one or both bonding layers may include silicon dioxide. However, it is contemplated that other bonding techniques may be utilized. It is also contemplated that micro-channels 106 may run through or within some or all of the layers between the substrate and the layer containing the heat generating devices, for example, layers 108, 110, 112, 114, & 116. It is contemplated that the path of the micro-channels may depend, in one embodiment, on the thermal transference and placement of any elements that control the flow of the fluid within the micro-channels. However, this is merely one embodiment and the path of the micro-channels may be selected based upon other factors.

It is contemplated that the layers of the microelectronic package without active electrical devices, in one embodiment, the layers between, and including, the microelectronic wafer 102 and the second bonding layer 116, may be considered inactive or electrically insulating material. Conversely, the layer or layers with active electrical devices, in one embodiment the layer of silicon 118, may be considered the active layer. It is further contemplated that, the micro-channels 106 may provide mechanical stress relief to the microelectronic package.

FIGS. 2 through 12 are a series of cross sectional diagrams of a microelectronic package illustrating one embodiment of a technique to fabricate an embodiment in accordance with the disclosed subject matter. It is contemplated that these figures illustrate a number of actions that may be removed or altered from additional embodiments of the disclosed technique.

Figure 2:
FIGS. 2 through 12 are a series of cross sectional diagrams of a microelectronic package illustrating one embodiment of a technique to fabricate an embodiment in accordance with the disclosed subject matter.
Figure 3:
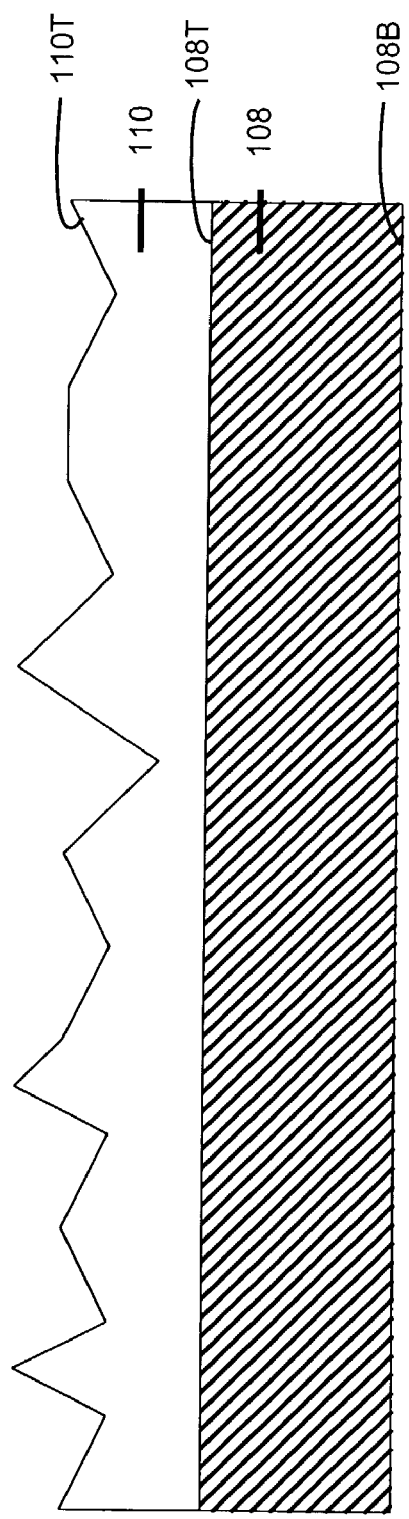

FIG. 2 illustrates that a substrate 108 may be selected. It is contemplated that the substrate may include, for example, single or poly-crystal silicon. It is further contemplated that the substrate has substantially flat top and bottom surfaces. FIG. 3 illustrates that a stop layer 110, may be deposited upon the top of the substrate. It is contemplated that the stop layer may be deposited utilizing a number of known sputter or chemical vapour deposition techniques.

Figure 4:
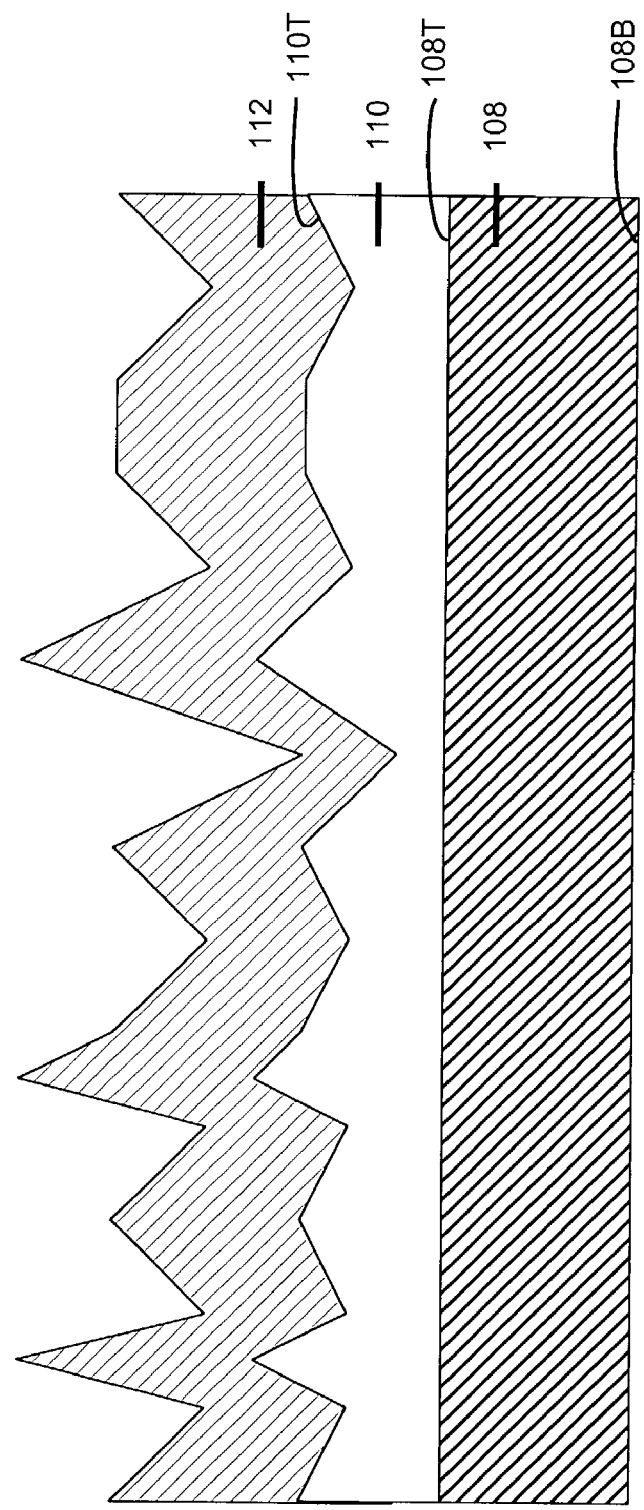
Figure 5:
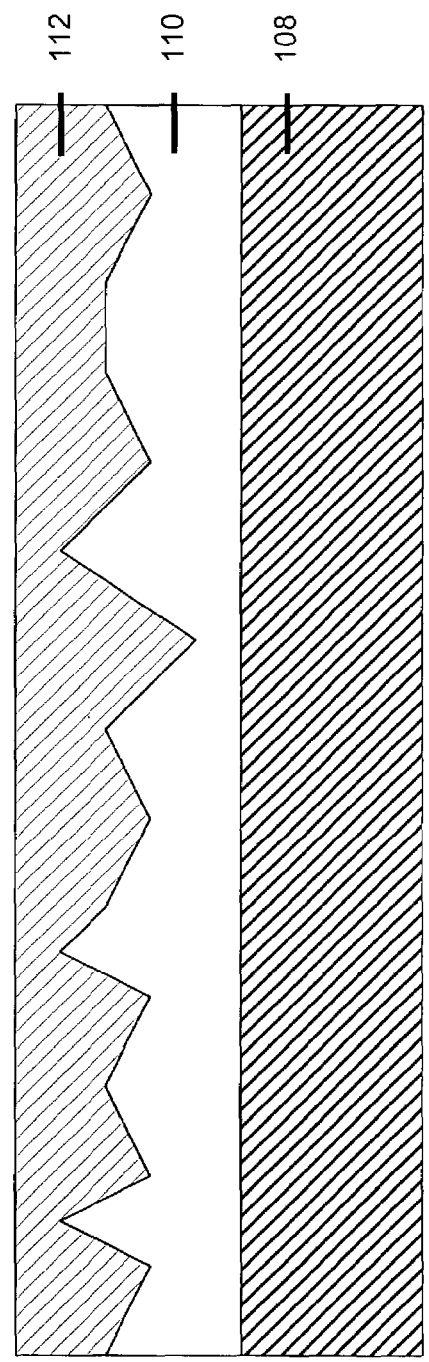
Figure 6:
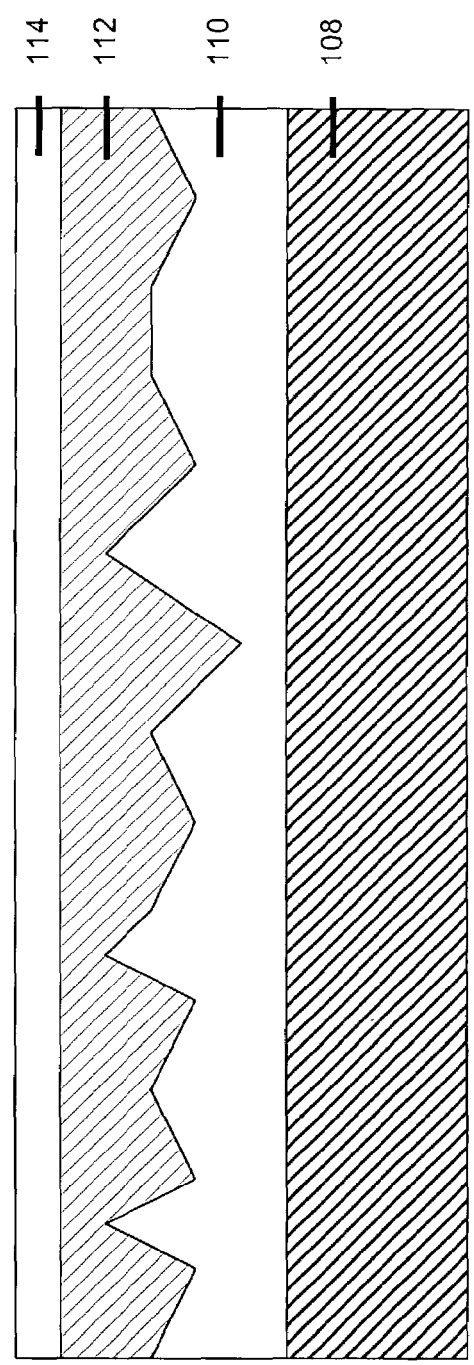

FIG. 4 illustrates that a fill layer 112 may be deposited on top of the stop layer 110. It is contemplated that the fill layer may include single or poly-crystal silicon. It is contemplated that the fill layer may be deposited utilizing a number of known techniques. FIG. 5 illustrates that the fill layer may be polished. It is contemplated that the stop layer 110 may be too hard to polish. FIG. 6 illustrates that a first bonding layer 114 may be grown on top of the fill layer 112.

Figure 7:
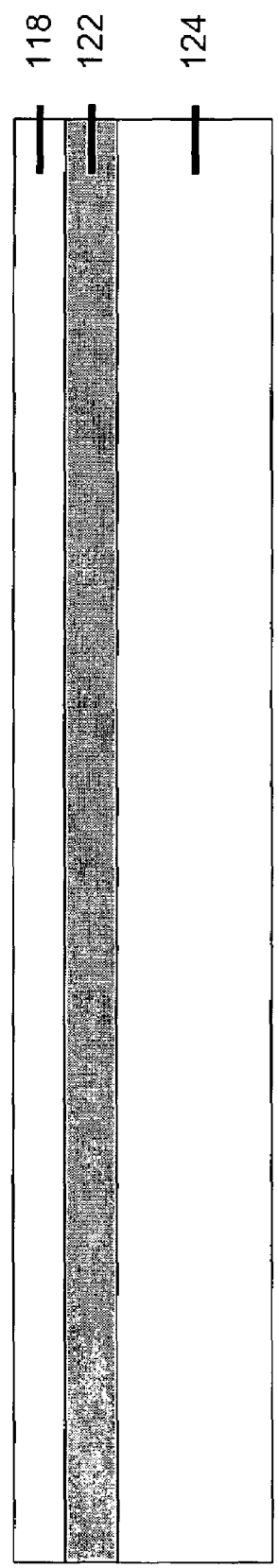
Figure 8:
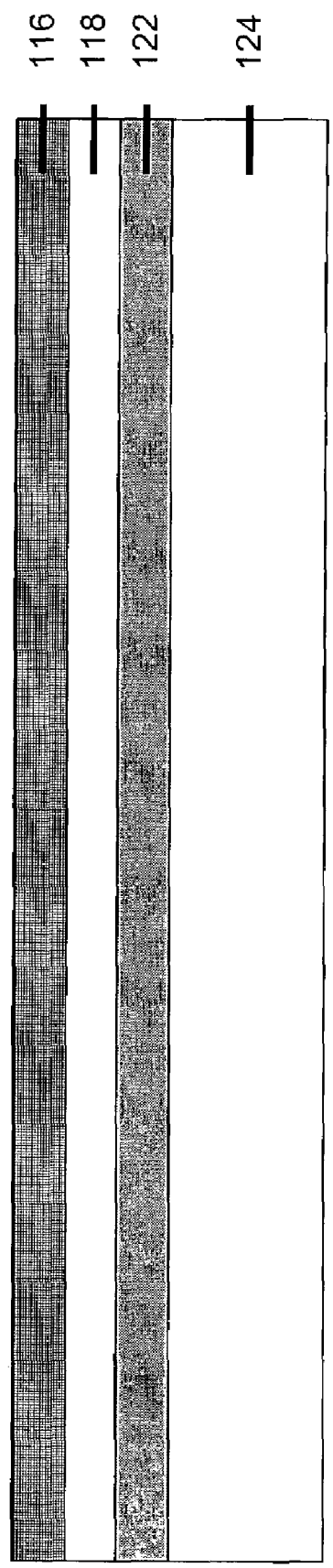
Figure 9:
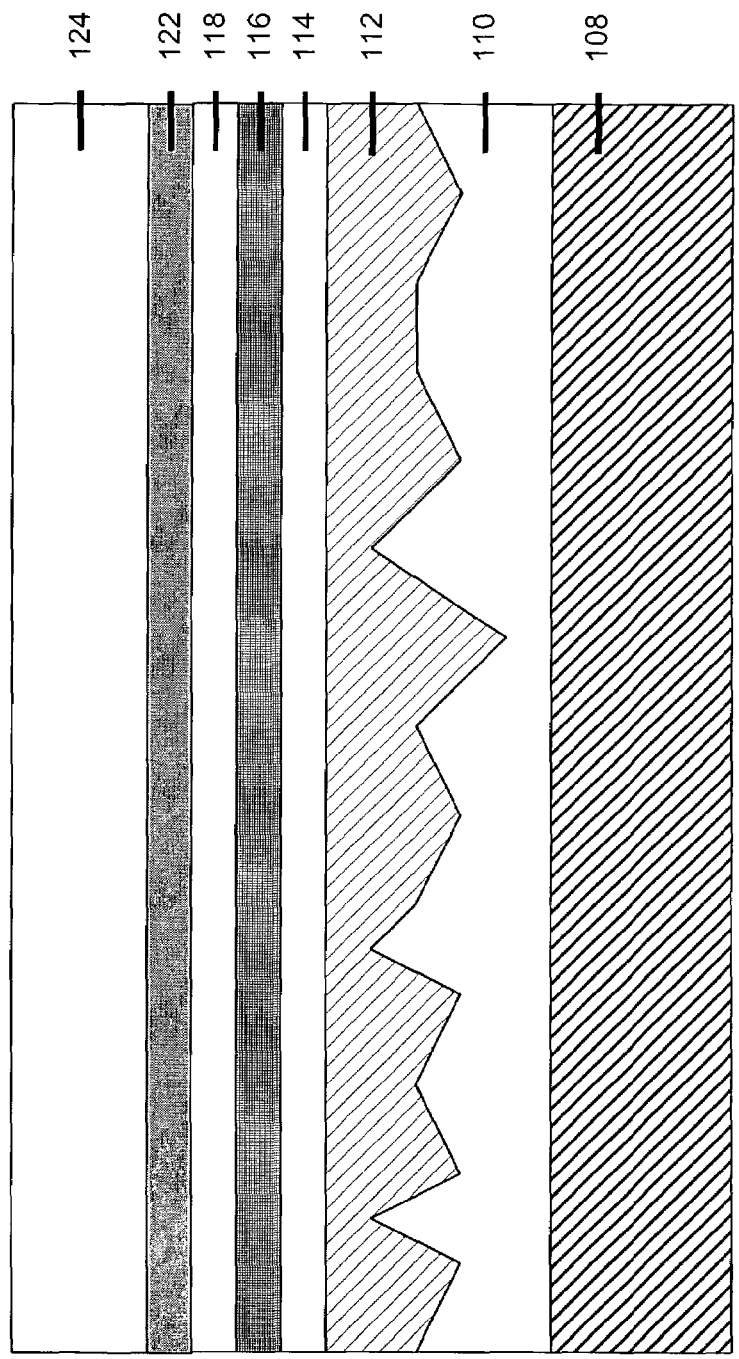
Figure 10:
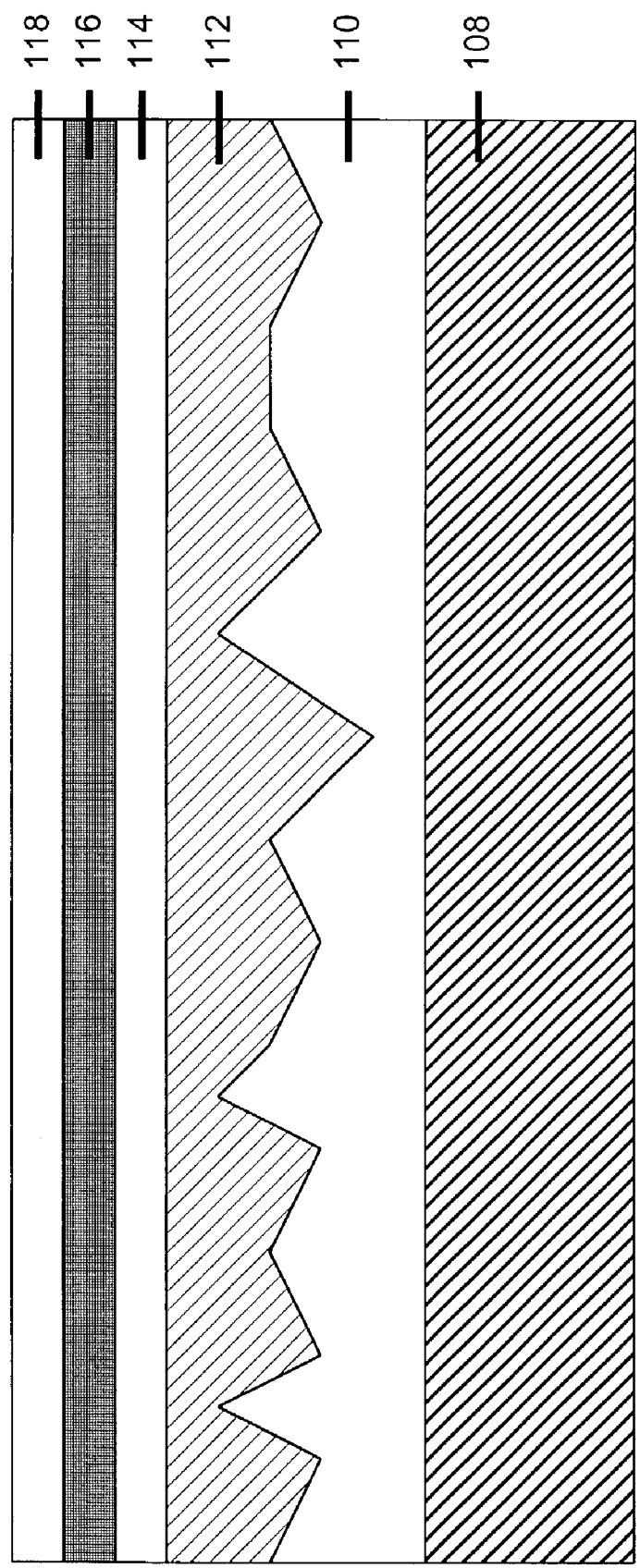

FIG. 7 illustrates that a cleave plane 122 may be formed within a second substrate, separating the substrate into a sacrificial layer 124 and a silicon substrate 118. It is contemplated that the second substrate may include single or poly-crystal silicon. FIG. 8 illustrates that a second bonding layer 116 may be grown on top of the silicon substrate 118. FIG. 9 illustrates that the second substrate may be bonded with the fill layer 114 utilizing the two bonding layers 114 & 116. It is contemplated the other bonding techniques, such as, for example, copper bonding, may be utilized. FIG. 10 illustrates that the sacrificial layer 124 and the cleave plane 122 may be removed, or cleaved off. It is contemplated that, a described above in regard to FIG. 1, active or passive devices, including electrical devices, may be fabricated utilizing silicon substrate 118.

Figure 11:
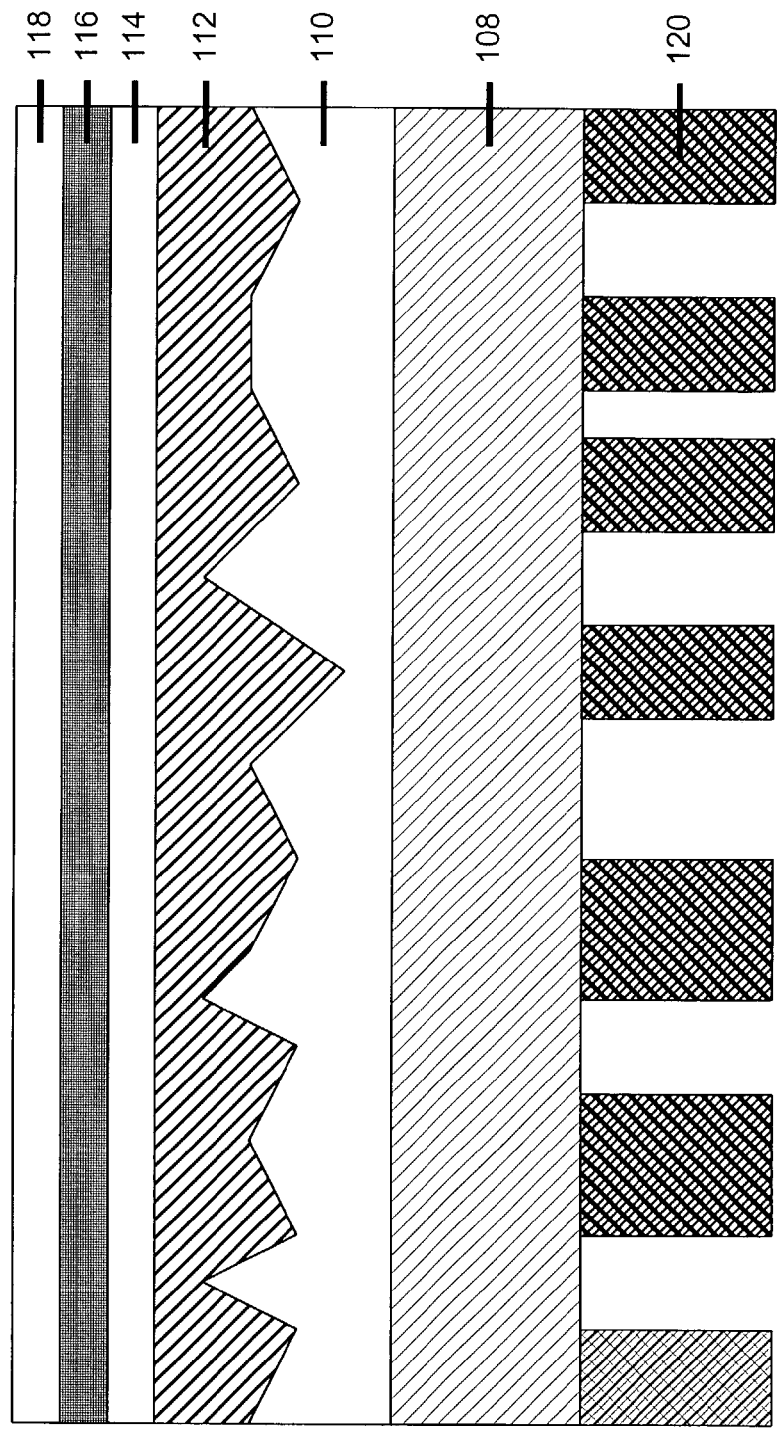
Figure 12:
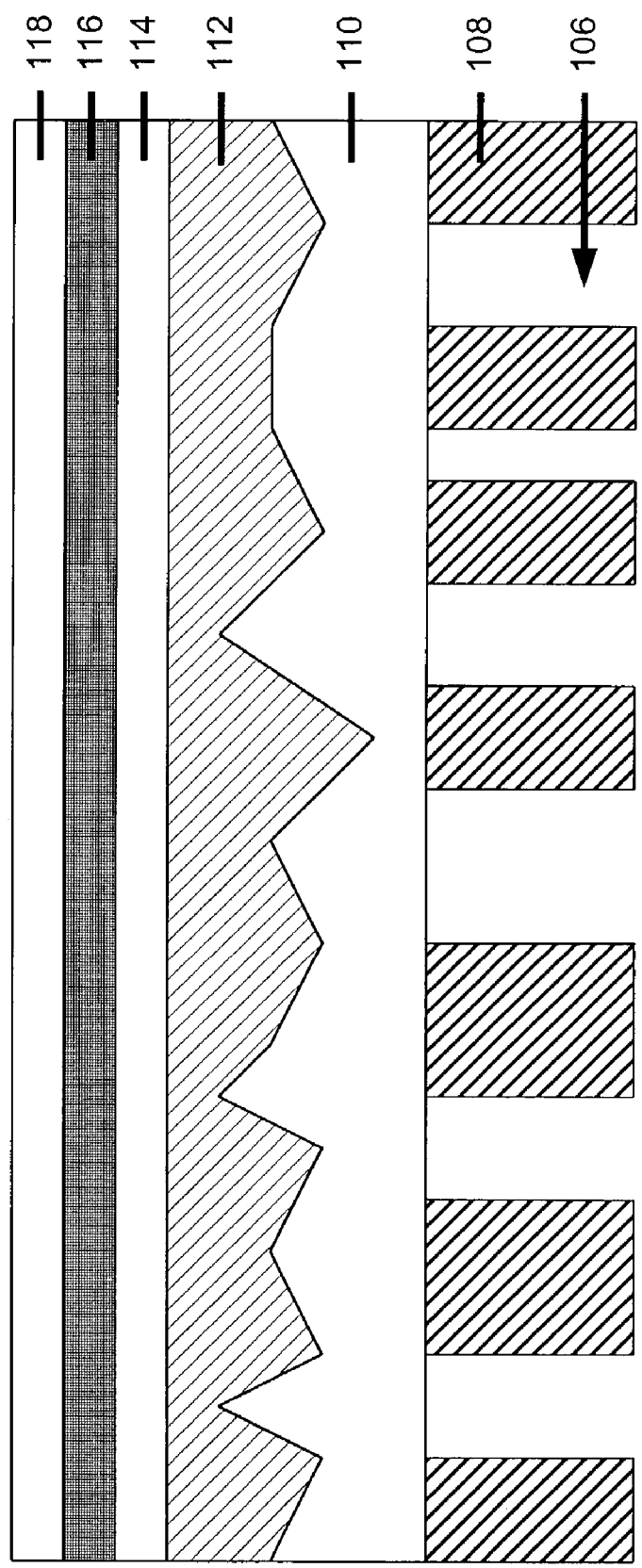

FIG. 11 illustrates that a layer of resist 120 may be used to pattern the micro-channels on the first or bottom substrate 108. FIG. 12 illustrates that the micro-channels 106 may be etched into the substrate 108. It is contemplated that other techniques besides etching may be used to fabricate the micro-channels. It is further contemplated that the etching process may stop when the substrate has been etched through to the stop layer 110.

FIG. 1 illustrates the final action, in one embodiment of the technique. It is contemplated that other embodiments may include additional actions. A microelectronic wafer 102 may be bonded to the substrate 108 to cap the microtrenches 106. The microelectronic wafer 102 may be bonded utilizing a layer of thermally conductive adhesive 104. It is contemplated that a number of other techniques may be used to bond the substrate 108 and the microelectronic wafer 102. The micro-channels 106 may be sufficiently capped so as to facilitate the passage of fluid.

It is contemplated that in one embodiment, the actions illustrated by FIGS. 6 through 10 may be skipped and any active electrical devices may be fabricated utilizing the fill layer 112. It is also contemplated that in one embodiment, the illustrated actions may be performed in a substantially different order. It is further contemplated that in other embodiments, additional devices and layers may be fabricated and that the micro-channels 106 may run or etched through additional layers besides the substrate 108.

While certain features of the disclosed subject matter have been illustrated and described herein, many modifications, substitutions, changes, and equivalents will now occur to those skilled in the art. It is, therefore, to be understood that the appended claims are intended to cover all such modifications and changes that fall within the true spirit of the disclosed subject matter.

What is claimed is:

1. An apparatus comprising:
    a first semiconductor structure including internal integrated cooling channels;
    a first bonding layer;
    a second bonding layer bonded to said first bonding layer; and
    a second semiconductor structure bonded to the first second semiconductor structure and including a layer of semiconductor material having a cleave plane formed therein wherein said second semiconductor structure includes a sacrificial layer.

2. The apparatus of claim 1 wherein at least one of said bonding layers includes silicon dioxide.

3. The apparatus of claim 1 wherein said second semiconductor structure is an active layer including integrated circuit devices.

* * * * *